United States Patent [19]

Kim

[11] Patent Number: 5,629,861

[45] Date of Patent: May 13, 1997

[54] NESTED MAXIMUM SPACE COMPUTATION AND EFFICIENT GENERATION OF NESTED SHAPE COMPLEMENTATION

[75] Inventor: Young O. Kim, Santa Clara, Calif.

[73] Assignee: International Business Machines Corporation, Armonk, N.Y.

[21] Appl. No.: 445,436

[22] Filed: May 19, 1995

[51] Int. Cl.$^6$ .................................................. G06F 17/50
[52] U.S. Cl. .......................... 364/490; 364/488; 364/491; 364/578
[58] Field of Search ..................... 364/488, 490, 364/491, 578; 395/500, 921; 250/492.2

[56] References Cited

U.S. PATENT DOCUMENTS

| | | | |
|---|---|---|---|
| 4,426,584 | 1/1984 | Bohlen | 250/492.2 |
| 4,815,003 | 3/1989 | Putatunda et al. | 364/491 |
| 4,949,162 | 8/1990 | Tamaki et al. | 357/71 |
| 5,046,012 | 9/1991 | Morishita et al. | 364/491 |
| 5,159,201 | 10/1992 | Frei | 250/492.2 |
| 5,182,718 | 1/1993 | Harafuji et al. | 364/490 |
| 5,206,815 | 4/1993 | Purcell | 364/491 |
| 5,309,371 | 5/1994 | Shikata et al. | 364/491 |
| 5,392,222 | 2/1995 | Noble | 364/490 |
| 5,398,195 | 3/1995 | Kim | 364/491 |
| 5,440,720 | 8/1995 | Baisuck et al. | 395/500 |
| 5,519,628 | 5/1996 | Russeu et al. | 364/489 |
| 5,526,279 | 6/1996 | Pick | 364/491 |
| 5,537,648 | 7/1996 | Liebmann et al. | 395/500 |

Primary Examiner—Kevin J. Teska
Assistant Examiner—Tan Nguyen
Attorney, Agent, or Firm—Whitham, Curtis, Whitham & McGinn; Stephen J. Kaufman, Esq.

[57] ABSTRACT

A method of nested maximum space computation is used for the processing of shapes in design data for integrated circuits and printed circuit electronic packages. This method determines the complement of a design level without unnecessary flattening or denesting thereby reducing the processing time and the volume of the output data. Native shapes are first expanded by one-half the maximum space ground rule value to get the expanded native shapes. The nested shape complementation method is applied to the expanded native shapes to get the error candidate shapes. The error candidate shapes indicate areas that are possible violations. Next, the expanded native shapes are subtracted from the error candidate shapes to get the real error shapes. The nested shape complementation method finds the regions between shapes in a hierarchical design without denesting. For each cell that does not have transforms of other cells, the nested shape complementation method finds the cell's proper frame and uses that frame and the cell's native shapes to create complemented shapes. For each cell with transforms of other cells, the nested shape complementation method finds the cell's proper frame and uses that frame, the cell's native shapes, and its transformed cell's frames to create complemented shapes. The complemented shapes are added to the cell as native shapes on a new design level.

11 Claims, 14 Drawing Sheets

NESTED MAXIMUM SPACE COMPUTATION AND EFFICIENT GENERATION OF NESTED SHAPE COMPLEMENTATION

CROSS-REFERENCE TO RELATED APPLICATIONS

The subject matter of this application is related to application Ser. No. 08/019,971 for "System and Method for Verifying a Hierarchical Circuit Design" by P. J. Russell and G. S. Weinert, application Ser. No. 08/019,927 for "System and Method for Formulating Subsets of a Hierarchical Circuit" by P. J. Russell and G. S. Weinert, now U. S. Pat. No. 5,519,628 application Ser. No. 08/019,924 for "Application Generator for Use in Verifying a Hierarchical Circuit Design" by P. J. Russell and G. S. Weinert, and application Ser. No. 08/019,970 for "System and Method for Building Interconnections in a Hierarchical Circuit Design" by Y. O. Kim, P. J. Russell and G. S. Weinert, all filed on Feb. 19, 1993, and assigned to a common assignee with this application. The subject matter of this application is also related to application Ser. No. 08/445,447 for "Efficient Generation of Fill Shapes for Chips and Packages" by D. G. Chesebro, Y. O. Kim, M. A. Lavin and D. N. Maynard and application Ser. No. 08/444,471 for "Efficient Generation of Negative Fill Shapes for Chips and Packages" by M. A. Lavin, Y. O. Kim, L. W. Liebmann, and D. G. Chesebro, both filed concurrently herewith and assigned to a common assignee with this application.

The foregoing applications are incorporated herein by reference.

BACKGROUND OF THE INVENTION

1. Field of the Invention

The present invention generally relates to the design and manufacture of integrated circuits and printed-circuit electronic packages whose structures consist of several layers of conducting, insulating and other materials that are structured in the horizontal dimension by fabrication processes and, more particularly, to a method of computing a maximum space restriction between shapes and generating shape complements without denesting the hierarchical data structure that defines the shapes, thereby considerably reducing the output data and the consequent processing time.

2. Background Description

Semiconductor integrated circuits and printed circuit electronic packages are generally structures consisting of several layers of conducting, insulating and other materials that are structured in the horizontal dimension by fabrication processes that transfer patterns defined in physical designs or layouts. These physical designs or layouts are typically represented as computer data consisting of two dimensional shapes in a hierarchical data structure that exploit the repetitive structure usually found in such circuits and packages. Some physical rule checking or shapes processing involves the distance or area between shapes. In particular, some integrated circuit chip processes impose a "maximum space" restriction between shapes on some fabrication layers. While minimum space methods are well established, the maximum space computation is difficult.

In some cases, the action of the fabrication processes is affected by the design patterns being transferred to the physical materials. For example, the local pattern density of the design, i.e., the fraction of area over which material is deposited (or removed) can affect the shapes and dimensions of features, with the "locality extent" dependent on the specific fabrication process. As a specific example, this can occur in reactive ion etching (RIE), in which an excess in local pattern density (meaning that less material is to be etched away) causes nearby pattern features to be too small (i.e., "overetched") due to relatively high concentration of etchants. This effect appears to act at a length scale of hundreds of micrometers to millimeters. Other processes that may be affected by local pattern density include lithographic patterning of resist materials and chemical-mechanical (so called "chemech") polishing (CMP).

The standard process for verifying maximum spacing of structures in the design has been to work on the design in flattened, or denested, form. An efficient representation for rule checking or shapes processing is to determine the complement of the designed shapes, which is then used for subsequent processing. The standard process for creating the complement of a design level is again to flatten, or denest, the shapes and subtract (complement) them from a frame. The problems with those methods which denest the hierarchical design data are as follows:

Every instance of every shape must be handled, which consumes computer processing time.

The result of the operation, a complemented design level, contains too much data to process efficiently.

Thus, what is needed is a maximum space computation method which processes the design data without denesting and an efficient generation of shape complementation, again without denesting the design data.

SUMMARY OF THE INVENTION

It is therefore an object of the present invention to provide a method of nested maximum space computation for the processing of shapes in design data for integrated circuits and printed circuit electronic packages.

It is another object of the invention to determine the complement of a design level without unnecessary flattening or denesting thereby reducing the processing time and the volume of the output data.

According to the invention, native shapes are first expanded by one-half the maximum space ground rule value to get the expanded native shapes. The nested shape complementation method is applied to the expanded native shapes to get the error candidate shapes. The error candidate shapes indicate areas that are possible violations. Next, the expanded native shapes are subtracted from the error candidate shapes to get the real error shapes.

The nested shape complementation method finds the regions between shapes in a hierarchical design without denesting. For each cell that does not have transforms of other cells, the nested shape complementation method finds the cells's proper frame and uses that frame and the cell's native shapes to create complemented shapes. For each cell with transforms of other cells, the nested shape complementation method finds the cell's proper frame and uses that frame, the cell's native shapes, and its transformed cell's frames to create complemented shapes. The complemented shapes are added to the cell as native shapes on a new design level.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

The invention may be implemented on a variety of hardware platforms, including personal computers (PCS), workstations, mini-computers, and mainframe computers. Many of the steps of the method according to the invention may be advantageously implemented on parallel processors of various types. Parallel processing is common in mainframe computers and increasingly more common in mini-computers and workstations. Therefore, by way of example and not limitation, there is first described a representative hardware environment on which the invention may be implemented.

Figure 1:
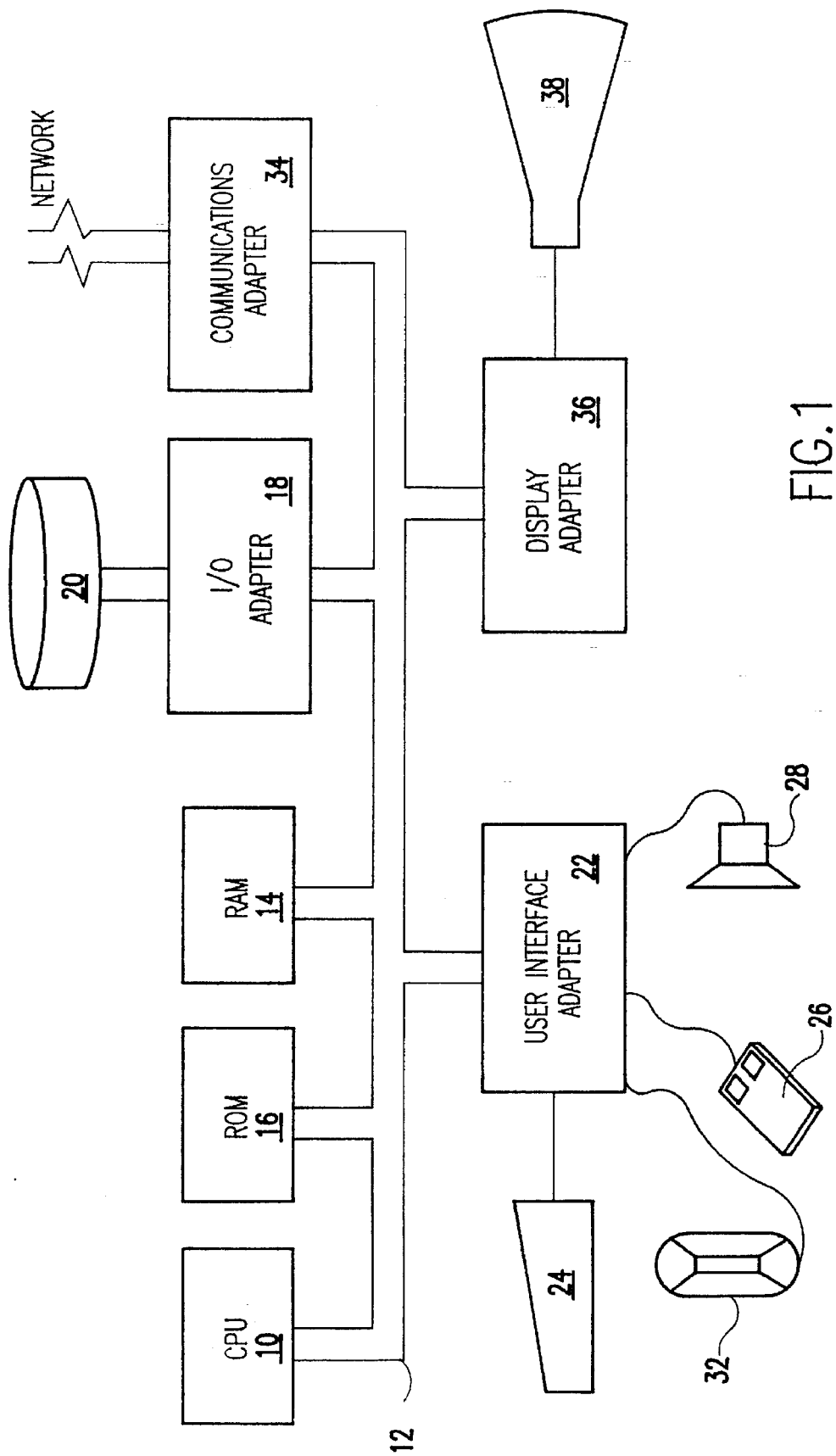
FIG. 1 is a block diagram showing a hardware configuration on which the subject invention may be implemented.

Referring now to the drawings, and more particularly to FIG. 1, there is shown a representative hardware environment which may be a personal computer, such as the International Business Machines (IBM) Corporation's PS/2 family of Personal Computers, or a workstation, such as IBM's RS/6000 Workstation. The hardware includes a central processing unit (CPU) 10, which may conform to Intel's X86 architecture or may be a reduced instruction set computer (RISC) microprocessor such as IBM's PowerPC® microprocessor. The CPU 10 is attached to a system bus 12 to which are attached a read/write or random access memory (RAM) 14, a read only memory (ROM) 16, an input/output (I/O) adapter 18, and a user interface adapter 22. The RAM 14 provides temporary storage for application program code and date, while ROM 16 typically includes the basic input/output system (BIOS) code. The I/O adapter 18 is connected to one or more Direct Access Storage Devices (DASDS), here represented as a disk drive 20. The disk drive 20 typically stores the computer's operating system (OS) and various application programs, each of which are selectively loaded into RAM 14 via the system bus 12. The user interface adapter 22 has attached to it a keyboard 24, a mouse 26, a speaker 28, a microphone 32, and/or other user interface devices (not shown). The personal computer or workstation also includes a display 38, here represented as a cathode ray tube (CRT) display but which may be a liquid crystal display (LCD) or other suitable display. The display 38 is connected to the system bus 12 via a display adapter 34. Optionally, a communications adapter 34 is connected to the bus 12 and to a network, for example a local area network (LAN), such as IBM's Token Ring LAN. Alternatively, the communications adapter may be a modem connecting the personal computer or workstation to a telephone line as part of a wide area network (WAN).

Definition of Terms

In the following description of the invention, certain terms are used in the description of the processes performed by the invention. These terms are defined below.

cell: A cell contains shapes and transforms of other cells. The shapes in a cell are said to be "native" to that cell.

most nested cell: The most nested cell is any cell that has no transforms of other cells.

native shape: A native shape is a shape within a cell.

nested shape: A nested shape is one that is a native or nested shape of any transformed cell.

ground rule: In this context, a ground rule is a value for the maximum distance allowed between shapes on a level.

error candidate shape: An error candidate shape indicates areas that may violate the maximum spacing rule.

error shape: An error shape indicates areas that violate the maximum spacing rule.

prime cell: A prime cell is that which contains all shapes, native and nested, that make up the design.

proper frame: A proper frame covers all shapes in a cell, both native and nested.

Note: for any cell, a proper frame must cover all native shapes and frames of transformed cells. Beyond this minimum requirement, the selection of a frame depends on the application and the data. There is a trade-off in efficiency in frame selection. Frames that are too large may reduce performance and increase data volumes because they include unnecessary complemented area. Frames that are too complex, because they fit the enclosed shapes tightly, will also reduce performance because complement shapes may be flattened. A proper frame can consist of several disjoint pieces as long as the minimum requirement of covering native shapes and frames is met.

rank order: A rank order is an ordering of the cells in which no cell transforms one that appears later.

transform of a cell: A transform of a cell is a call of one cell by another.

Sample Design Description for the Nested Shape Complementation

Figure 2:
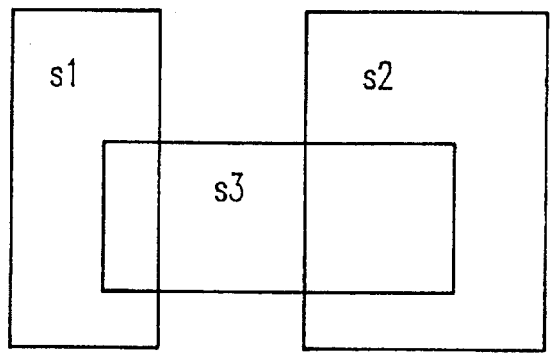
FIG. 2 is an illustration of a cell with three native shapes.
Figure 3:
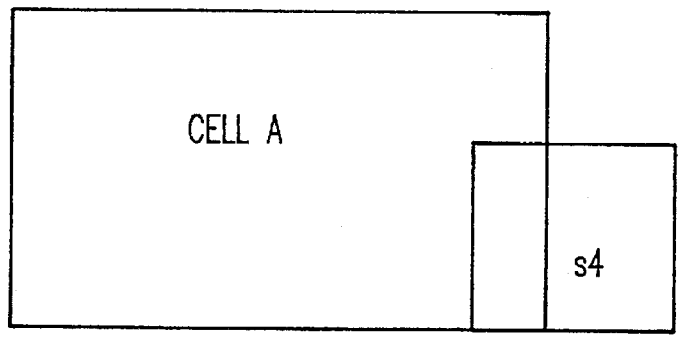
FIG. 3 is an illustration of a cell including the cell of FIG. 2 and a fourth native shape.
Figure 4:
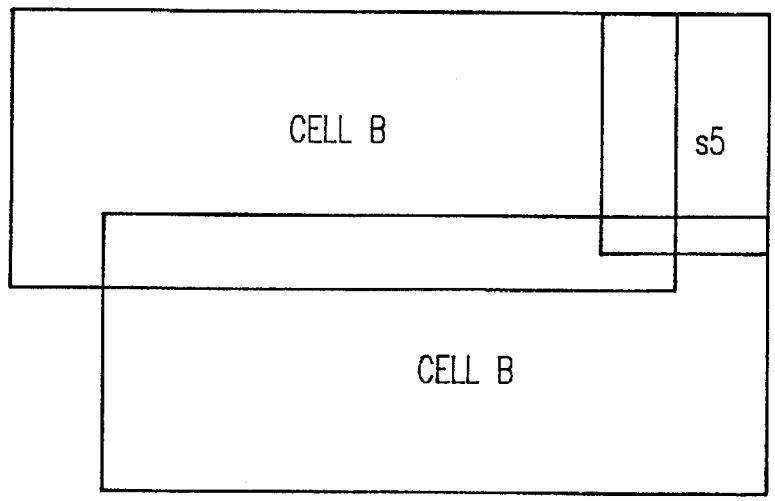
FIG. 4 is an illustration of a prime cell including two frames of the cell shown in FIG. 3 and a fifth native shape.

Referring next to FIG. 2, there is shown an example of a cell, here called cell A, containing three native shapes, denoted s1, s2 and s3. In FIG. 3, cell B contains one transform of cell A and a fourth native shape, s4. FIG. 4 shows a prime cell which contains two transforms of cell B and native shape s5.

Outline of the Processing Steps for the Nested Shape Complementation

In broad outline, the invention generates complement shapes in the physical design in the following steps in cell rank order:
1. Generate a frame for a cell.
2. Generate complement shapes for that cell.
3. Store the complement shapes and frames generated in that cell.

Example of Nested Shapes Complementation

The example used here to describe the complementation process is a single design level. The nested shapes complementation can create a single complemented level from multiple levels by subtracting the native shapes of each level from the frame.

Figure 5:
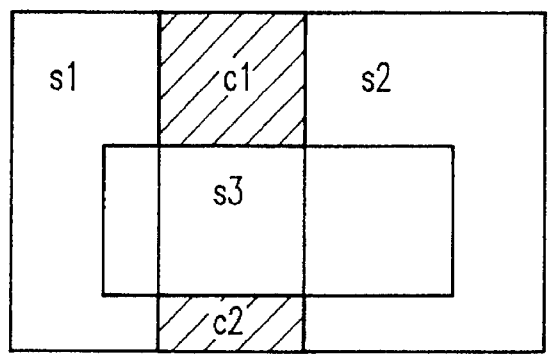
FIG. 5 is an illustration of forming two complement shapes by removing the three native shapes from a bounding box of the cell shown in FIG. 2.

For cell A shown in FIG. 2, let the frame of cell A be the bounding box of cell A. By removing shapes s1, s2 and s3, the complement shapes c1 and c2 shown in FIG. 5 are obtained. These complement shapes are stored with the frame of cell A.

Figure 6:
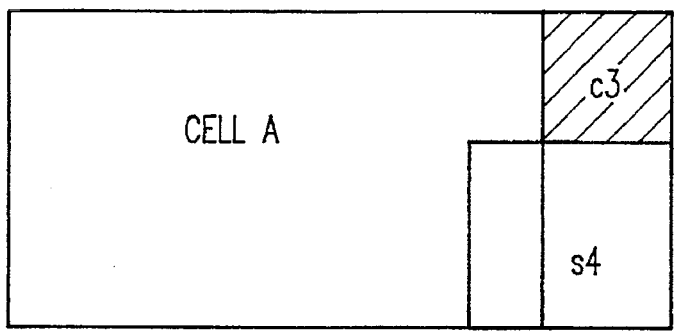
FIG. 6 is an illustration of forming a complement shape by removing the native shape from a bounding box of the cell shown in FIG. 3.

For cell B shown in FIG. 3, let the frame of cell B be the bounding box of cell B. Removing shape s4 and the frame of cell A from cell B yields the complement shape c3 shown in FIG. 6. This complement shape is stored with the frame of cell B.

Figure 7:
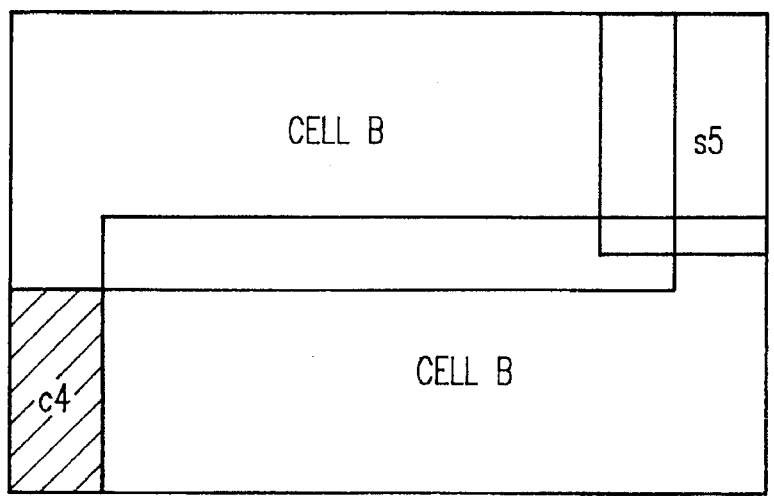
FIG. 7 is an illustration of forming a complement shape by removing the native shape from a bounding box of the prime cell shown in FIG. 4.

For the prime cell shown in FIG. 4, let the frame of the prime cell be the bounding box of the prime cell. Removing shape s5 and the two frames of cell B from the prime cell yields the complement shape c4 shown in FIG. 7, which is stored with the prime cell.

Thus, each cell contains its complemented shapes. The result is a nested complementation of the original design level within each cell. To obtain the "true" complementation, the overlaps between the complement shapes and the shapes on the original level are removed. The nested shape complementation is then completed.

Sample Design Description for the Nested Maximum Space Computation

Figure 8:
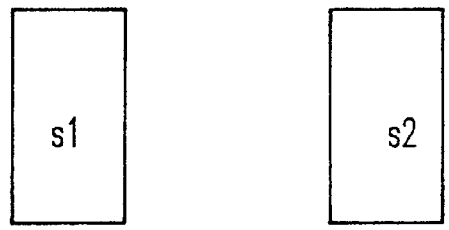
FIG. 8 is an illustration of a cell containing two native shapes.
Figure 9:
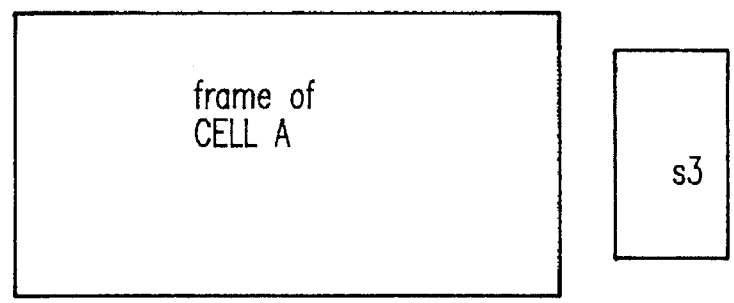
FIG. 9 is an illustration of a cell containing the cell of FIG. 8 and a third native shape.
Figure 10:
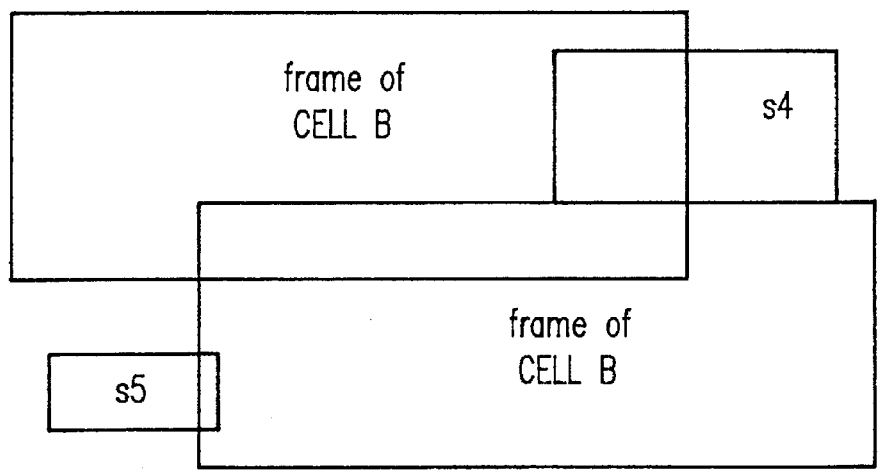
FIG. 10 is an illustration of a prime cell containing two transforms of the cell shown in FIG. 8 and two additional native shapes.

Referring next to FIG. 8, there is shown an example of a cell, here called cell A, containing two native shapes, denoted s1 and s2. In FIG. 9, cell B contains cell A and a third native shape, s3. FIG. 10 shows a prime cell which contains two transforms of cell B and native shapes s4 and s5.

Outline of the Processing Steps for the Nested Maximum Space Computation

In broad outline, the invention generates error candidate shapes in the physical design in the following steps:
1. Loop through the cells in cell rank order (that is, starting with the most nested cell and ending with the prime cell). For each cell:
   a. Expand each native shape by half the maximum space ground rule value.
   b. Expand each expanded shape by half the maximum space ground rule value, then shrink by the same amount. (The expand and shrink values are not critical, but must be the same.) Geometrically union these expanded-then-shrunk shapes with the frames of nested cells (if any) to obtain a proper frame.
   c. Store the frame in the cell.
   d. Geometrically subtract the expanded shapes and the frames of nested cells from the frame. The result is a set of error candidate shapes (if any).
   e. Store the error candidate shapes in the cell.
2. Remove overlaps between the error candidate shapes and the original shapes to obtain the error shapes.

Example of Nested Maximum Space Computation

Figure 11:
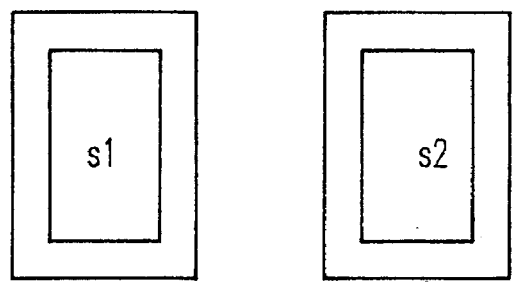
FIG. 11 is an illustration of expanding the native shapes in the cell of FIG. 8.
Figure 12:
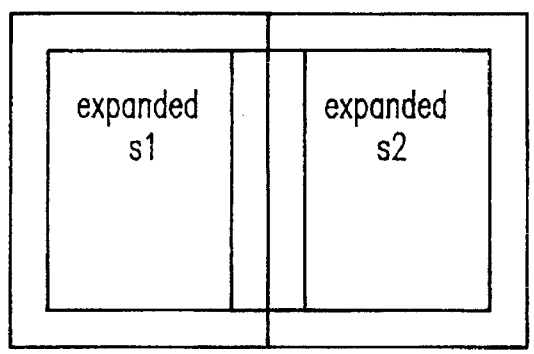
FIG. 12 is an illustration of expanding and then shrinking the shapes shown in FIG. 11 to produce a frame for the cell.
Figure 13:
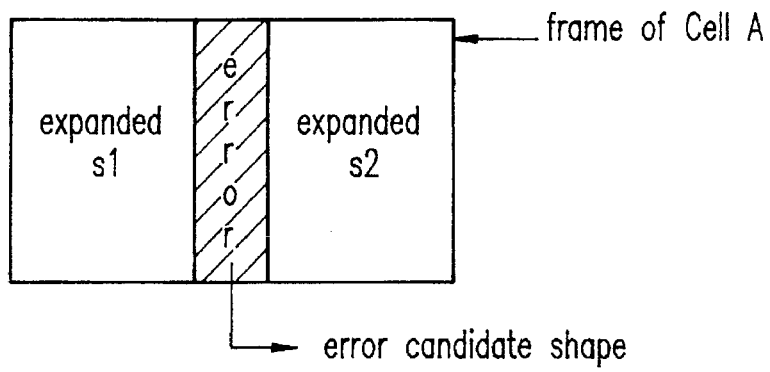
FIG. 13 is an illustration of subtracting the expanded shapes from the cell shown in FIG. 8 to create an error candidate shape.

This example uses a single design level. The method can check multiple levels by subtracting the expanded native shapes of each level from the frame. Taking cell A as shown in FIG. 8 having native shapes s1 and s2, these shapes are expanded by one half of the maximum space ground rule value, as shown in FIG. 11. The expanded shapes of s1 and s2 are again expanded by one half the maximum space ground rule value and shrunk back that much to produce a frame for cell A, as shown in FIG. 12. The expanded shapes of s1 and s2 are subtracted from the frame of cell A to create the error candidate shape shown in FIG. 13. The error candidate shape is stored in cell A.

Figure 14:
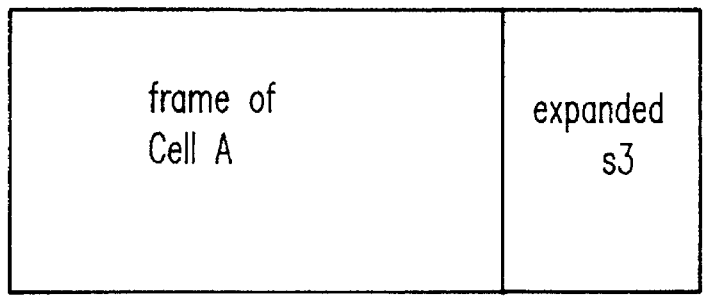
FIG. 14 is an illustration of expanding the native shape in the cell of FIG. 9.
Figure 15:
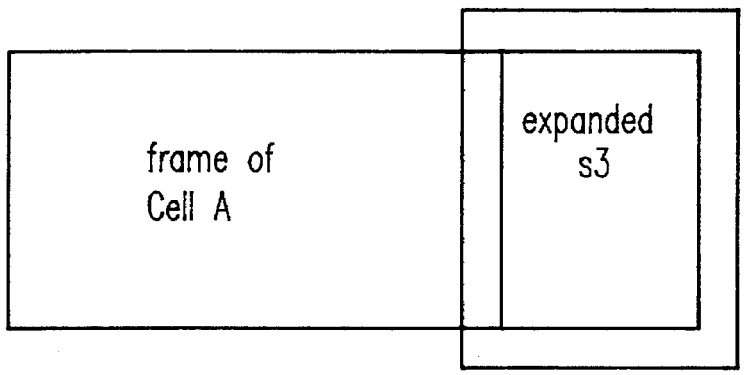
FIG. 15 is an illustration of expanding and then shrinking the shape shown in FIG. 14 to produce a frame for the cell.
Figure 16:
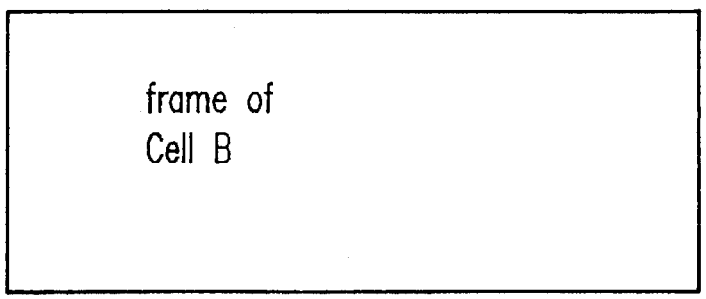
FIG. 16 is an illustration of subtracting the expanded shape from the cell shown in FIG. 9 resulting in no error candidate shape.

Cell B as shown in FIG. 9 contains cell A and native shape s3. The native shape s3 is expanded by one half the maximum space ground rule value, as shown in FIG. 14. To make the frame for cell B, the expanded shape s3 is expanded and shrunk and the results unioned with the frame of cell A, as shown in FIG. 15. Note that the frame of cell A is not expanded and shrunk in this operation. Finally, subtracting the expanded shape s3 and the frame of cell A from the frame of cell B yields no error candidate shapes in cell B, as shown in FIG. 16.

Figure 17:
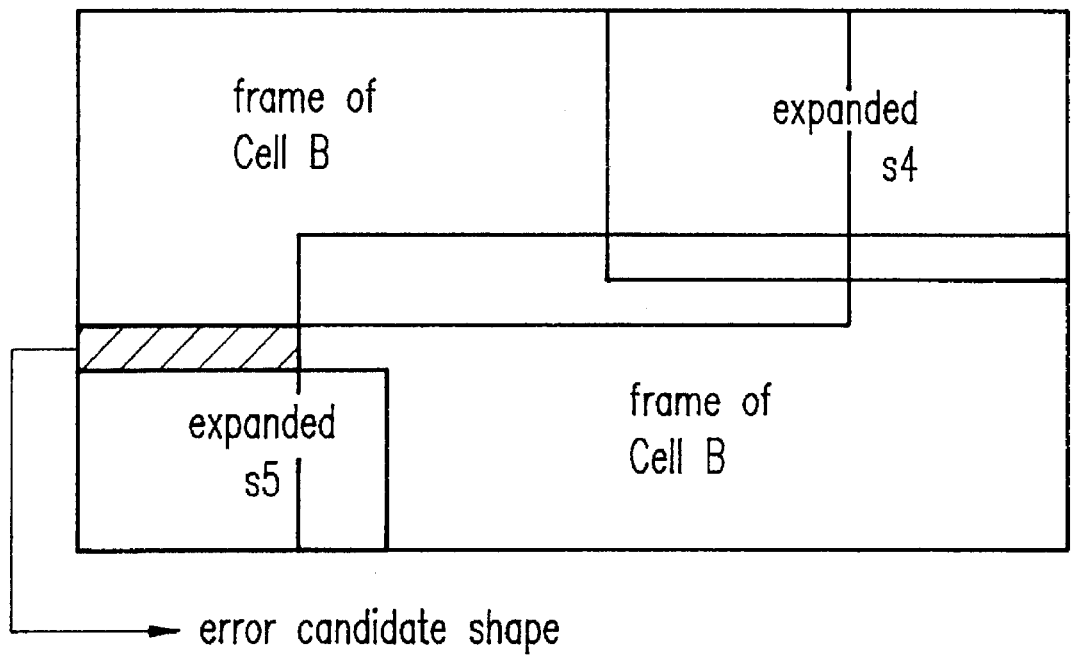
FIG. 17 is an illustration subtracting the expanded shapes and the two frames of the cell shown in FIG. 9 from the prime cell to produce error candidate shapes.
Figure 18:
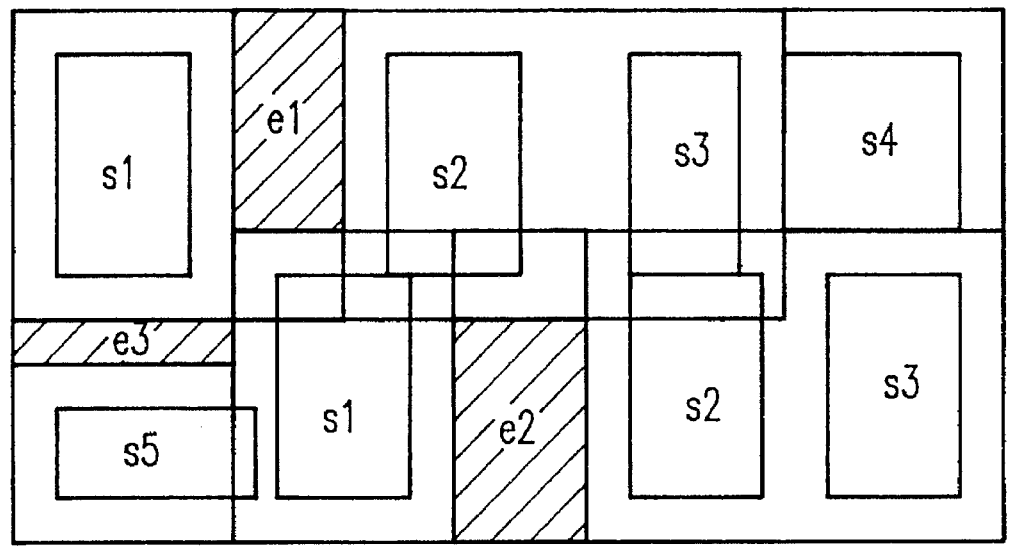
FIG. 18 is an illustration of removing overlaps between the error candidate shapes and the expanded native shapes in all cells to yield real error shapes.

The prime cell shown in FIG. 10 contains two transforms of cell B and the native shapes s4 and s5. Subtracting the two frames of cell B and the expanded shapes s4 and s5 yields the error candidate shape shown in FIG. 17. Removing the overlaps between the error candidate shapes and the expanded native shapes in all cells yields the real error shapes shown in FIG. 18. The real error shapes are denoted e1, e2 and e3 in this example and indicate the maximum space rule violation.

Nested Shape Processing

Figure 19:
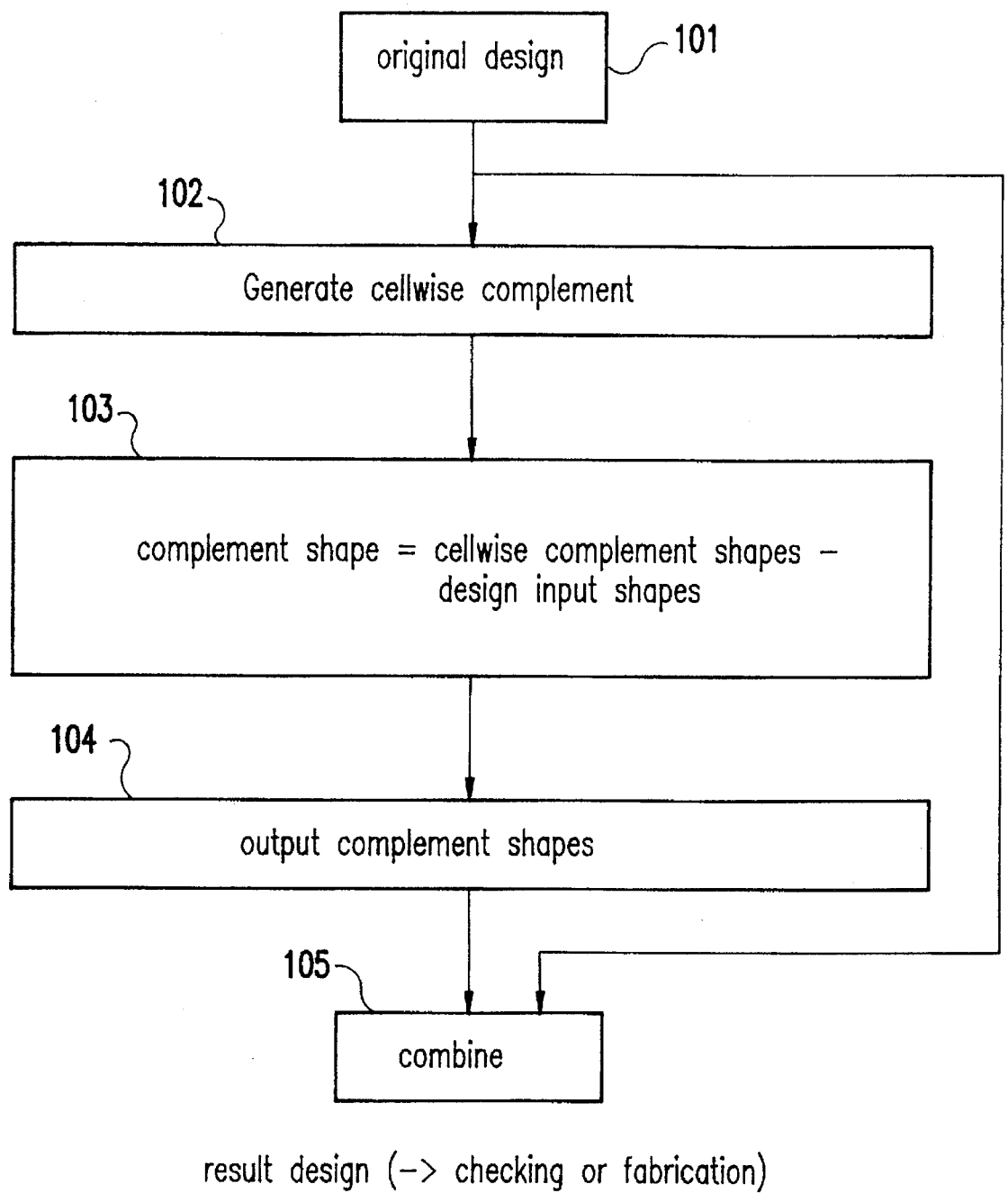
FIG. 19 is a top-level flowchart showing the process for complement shape generation.

FIG. 19 is a top-level flow chart for the nested shape processing according to the invention. This process is implemented on a hardware platform of the type generally shown in FIG. 1. In FIG. 19, the original design data is input at input block 101. Cellwise complements are generated in function block 102. This procedure is shown in more detail in FIG. 20, to which reference is now made.

Figure 20:
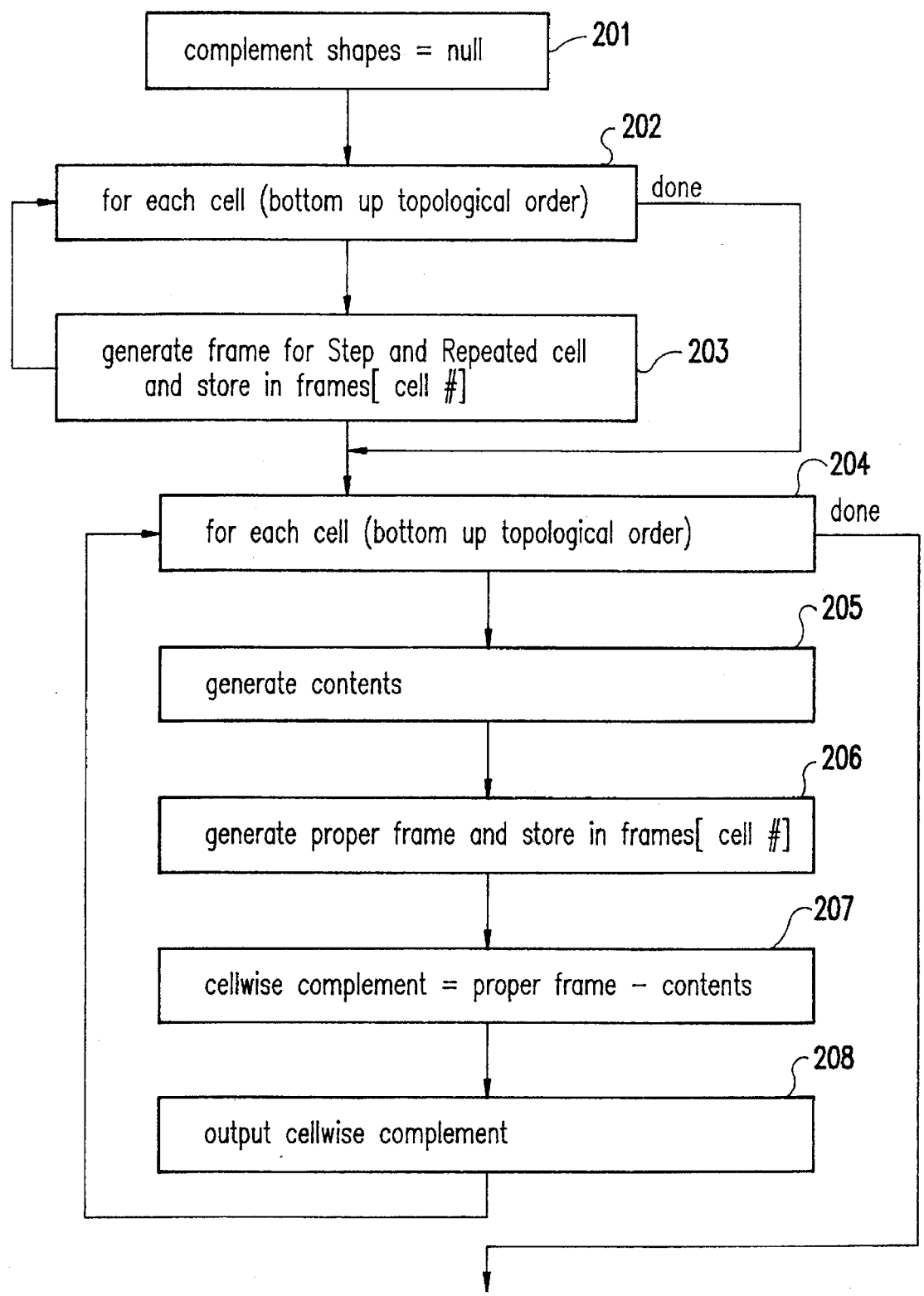
FIG. 20 is a flowchart showing the procedure called in FIG. 19 for generating the cellwise complement.
Figure 21:
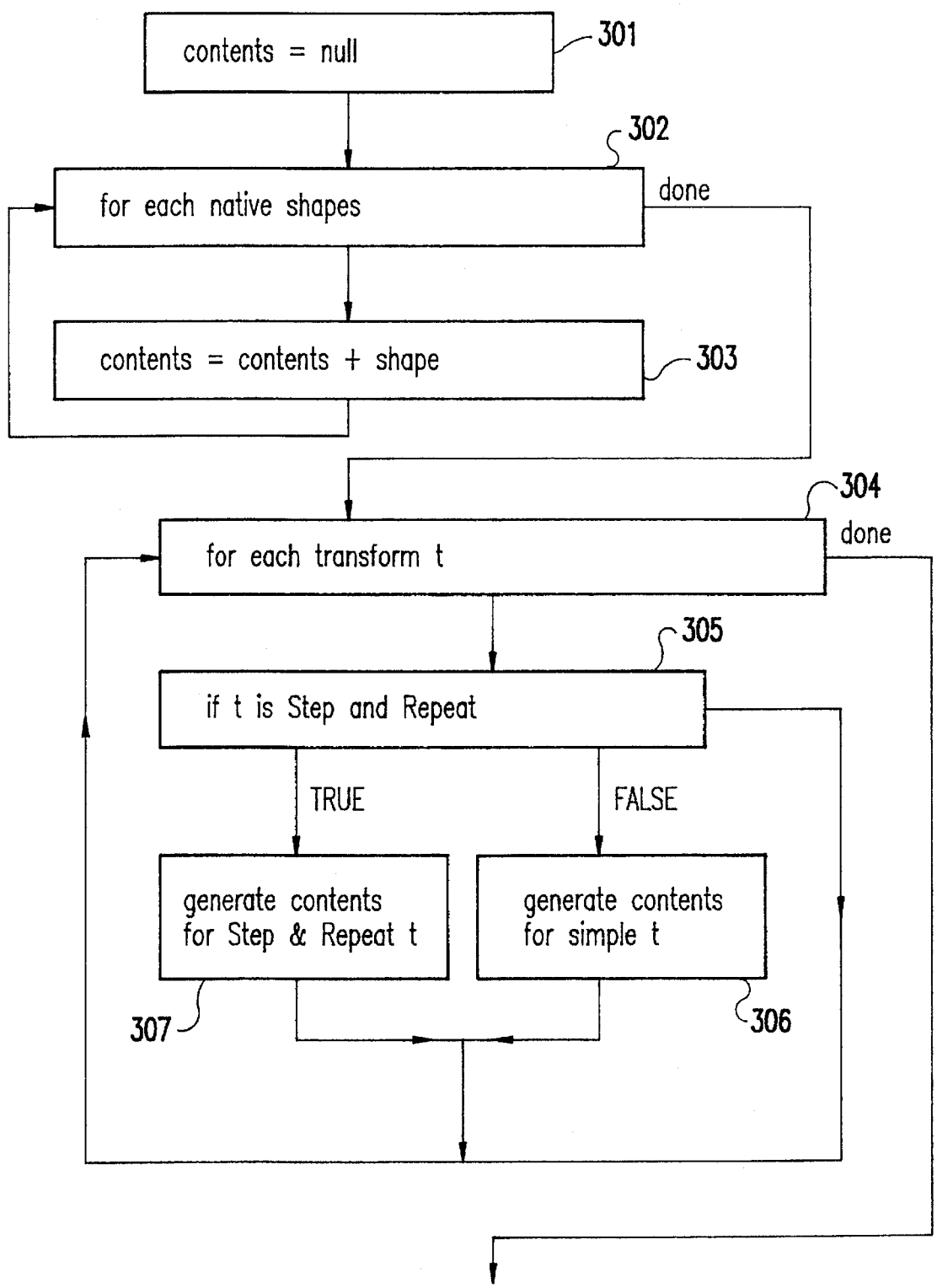
FIG. 21 is a flowchart showing the procedure called in FIG. 20 for generating contents.
Figure 24:
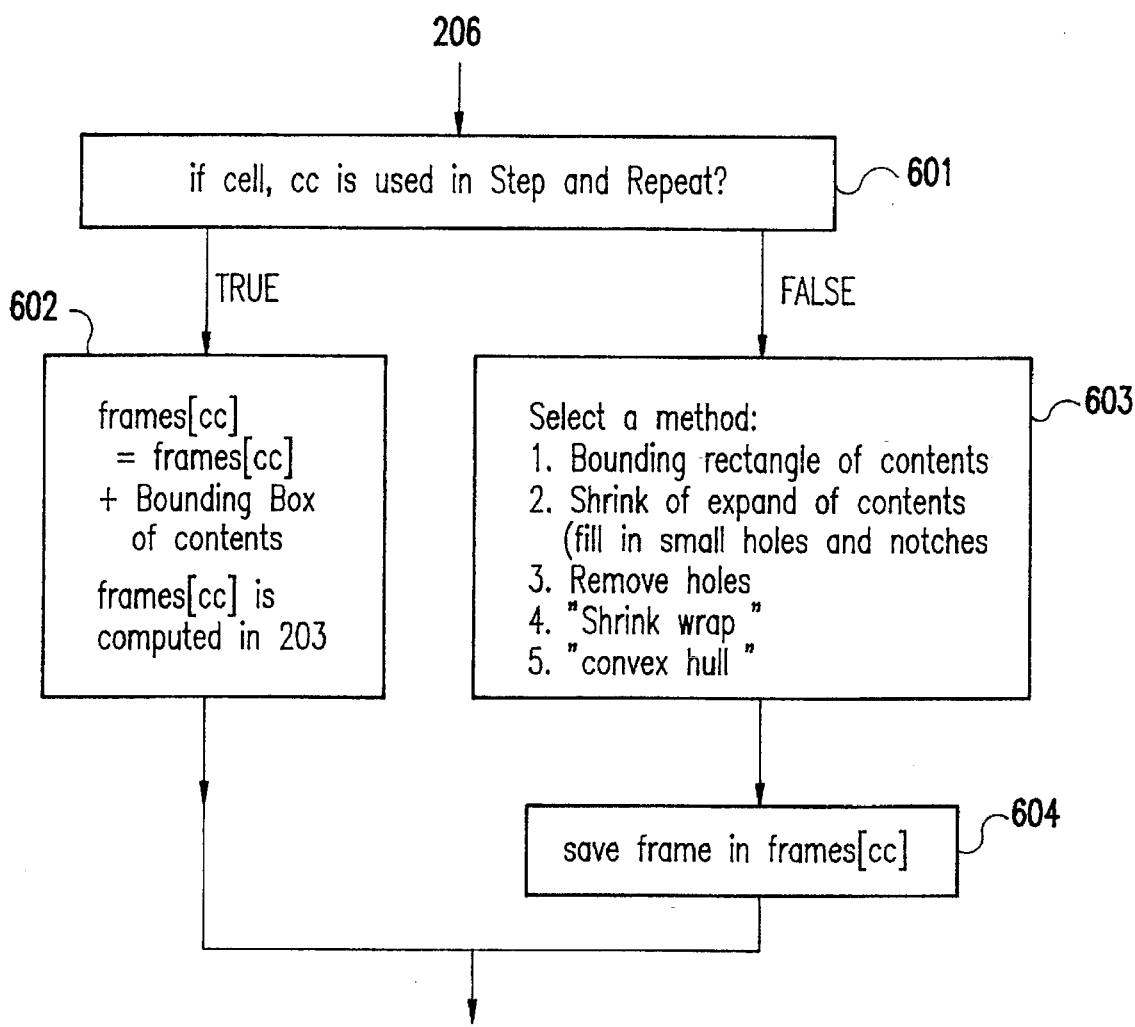
FIG. 24 is a flowchart showing the procedure called in FIG. 22 for generating a frame for the simple transform.

In FIG. 20, the complement shapes are initially a null set in input block 201. The procedure then enters a loop at decision block 202 where a determination is made as to whether all cells have been processed in rank or topological order. Function block 203 calls the procedure shown in FIG. 25, which is described in more detail below, to generate a rectangular frame for a step and repeated cell. This routine prepares a frame that has enough coverage when the frame is used in a step and repeat transform by higher rank cells. The generated frame is stored in frames[cell#]. When all cells have been processed, a second loop is entered at decision block 204 where, again, a determination is made as to whether all cells have been processed in rank or topological order. For each cell, the first step in this second loop is to call the generate contents procedure in function block 205. This procedure is illustrated in FIG. 21, which is described in more detail below. After a return is made from the generate contents procedure, the proper frame is generated in function block 206 and stored in frames [cell#]. Then a cellwise complement is made in function block 207 by subtracting the contents generated in the procedure of function block 205 from the proper frame generated in function block 206. This procedure is shown in FIG. 24 and described in more detail below. Finally, the cellwise complement is output in function block 208. At this point, the procedure loops back to decision block 204, and when all cells have been processed, a return is made to the main program shown in FIG. 19.

Turning now to FIG. 21, the procedure to generate contents called in function block 205 in FIG. 20 will now be described. In FIG. 21, the contents are initially a null set in input block 301. The procedure then enters a loop at decision block 302 where a determination is made as to whether all native shapes have been processed. If not, the set contents is updated by adding the next shape in function block 303. When all native shapes have been added to the contents, the procedure enters a second loop at decision block 304 where a determination is made as to whether all transforms have been processed. For each transform, a decision is made in decision block 305 as to whether the current transform is a step and repeated transform. If not, a generate contents for a simple transform is called in function block 306; otherwise, a generate contents of a step and repeat transform is called in function block 307. When a return is made from either of the procedures called in function blocks 306 or 307, the process loops back to decision block 304 to process the next transform. When all the transforms have been processed, a return is made to function block 205 in the process shown in FIG. 20, which made the call.

Figure 22:
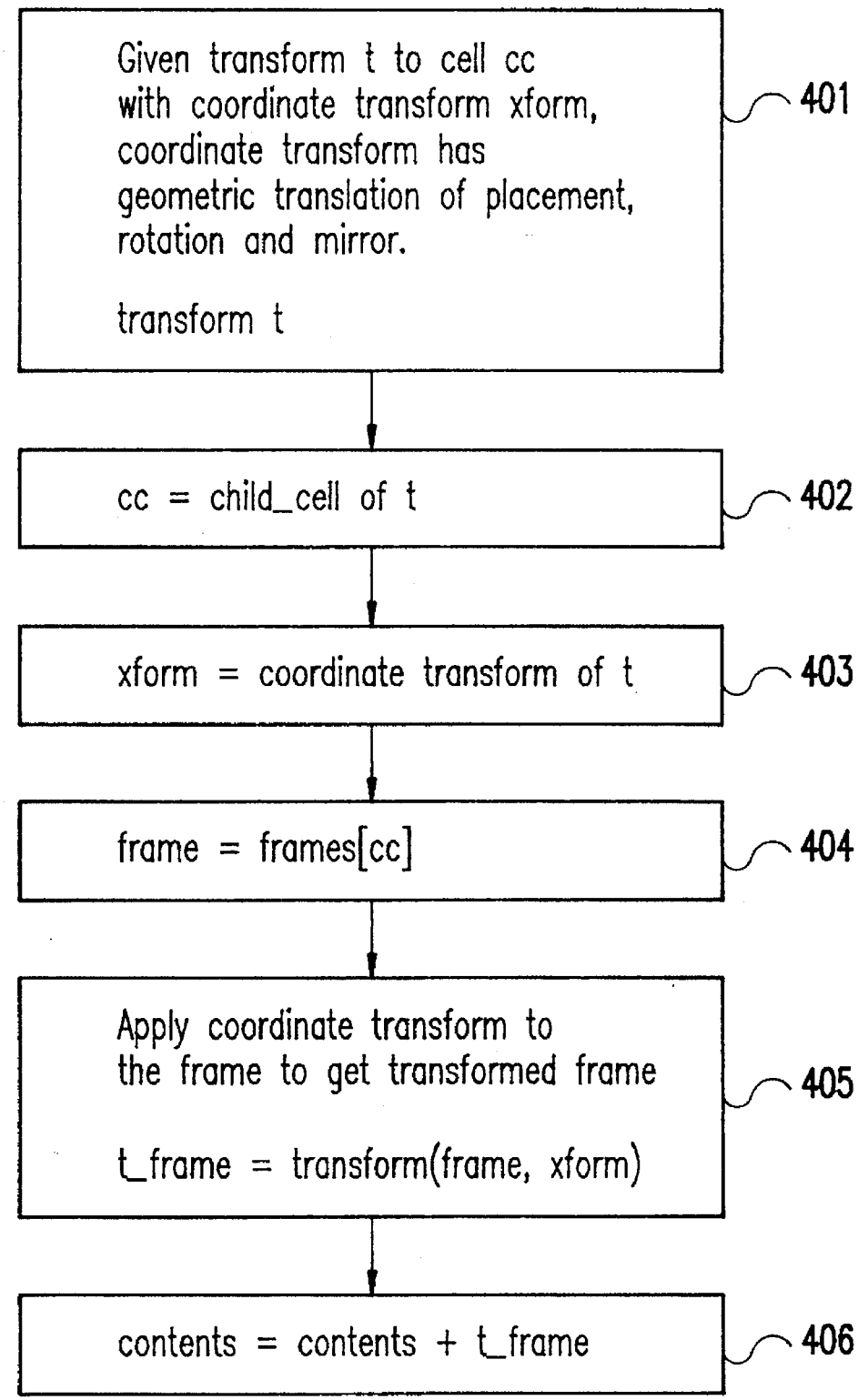
FIG. 22 is a flowchart showing the procedure called in FIG. 21 for generating contents for a simple transform.

The procedure generate contents for a simple transform called in function block 306 is shown in FIG. 22, to which reference is now made. The call to generate the contents for a simple transform t is input at input block 401. Given a transform t to cell cc, where cc=child_cell, with coordinate transform xform, the coordinate transform has a geometric translation of placement, rotation and mirror. A cell of the transform is identified as a child_cell of the transform in function block 402. The transform xform is then computed in function block 403 as a coordinate transform of the transform t. The child_cell's frame is retrieved from frames [cc] that was previously stored. Note again that processing is being done by rank order (i.e., bottom up). This procedure is called in function block 404. Then, the transform frame, t_frame, is computed function block 405 as the transform of the frame computed in function block 404 and the xform computed in function block 403. Finally, the contents is updated in function block 406 by adding the t_frame computed in function block 405. At this point a return is made to function block 306 in FIG. 21 which called the procedure.

Figure 23:
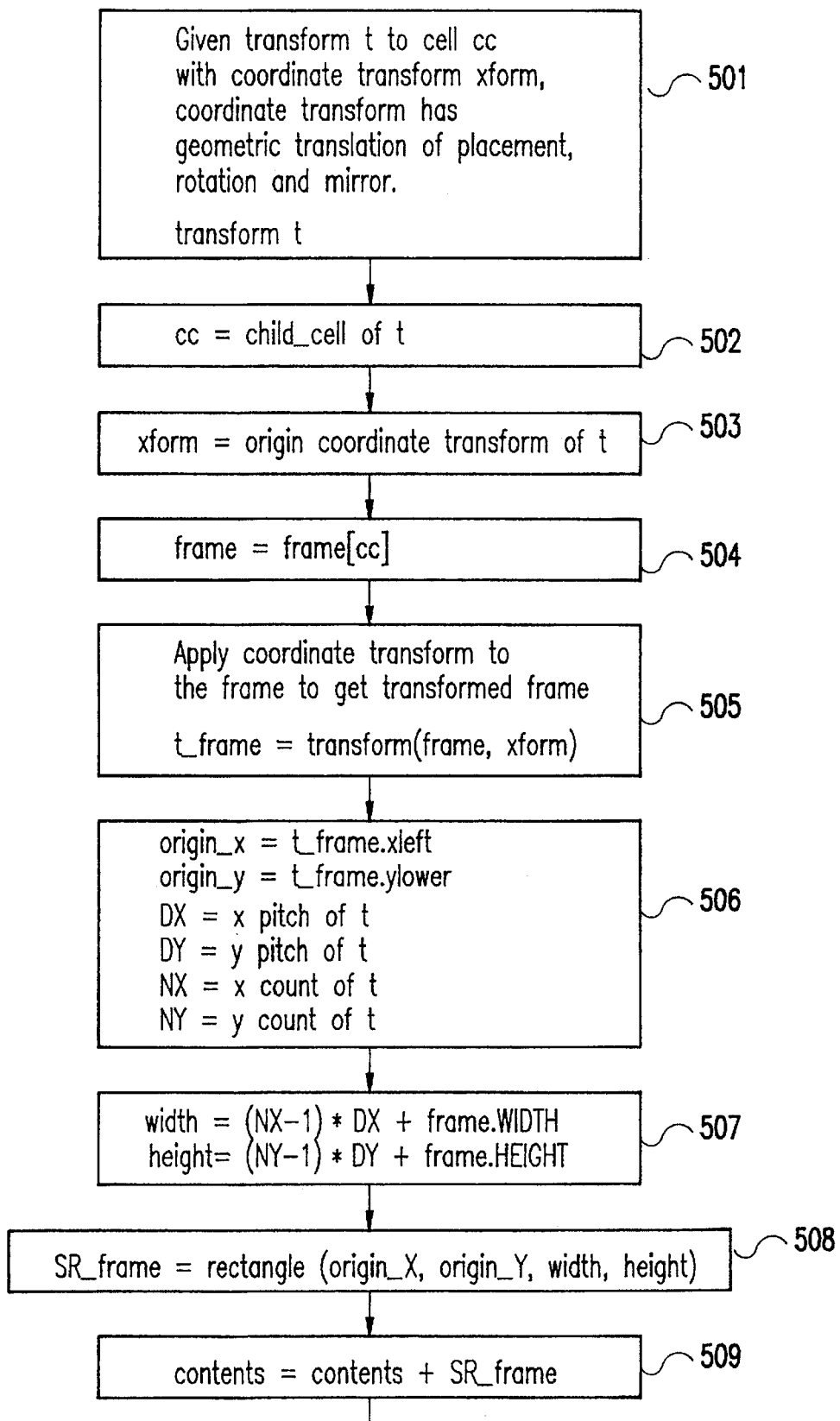
FIG. 23 is a flowchart showing the procedure called in FIG. 21 for generating contents for a step and repeat transform.

The procedure generate contents for a step and repeated transform called in function block 307 of FIG. 21 is shown in FIG. 23, to which reference is now made. In FIG. 23, the step and repeated transform t to cell cc call is input at input block 501, where again cc=child_cell. Given a transform t of cell cc with a coordinate transform xform, the coordinate transform has a geometric translation of placement, rotation and mirror. A cell of the transform is identified as a child_cell of the transform t in function block 502. The transform xform is then computed in function block 503 as the origin coordinate transform of the transform t. The child_cell's frame is retrieved from frames[cc] where it was previously stored. Again the processing is by rank order (i.e., bottom up). This procedure is called in function block 504. Then, the transform frame, t_frame, is computed in function block 505 as the transform of the frame computed in function block 504 and the xform computed in function block 503. At this point, several parameters are computed in function block 506. These coordinates are origin-X, the X coordinate of the lower left corner of the t_frame, origin-Y, the Y coordinate of the lower left corner of the t_frame, DX, the X pitch of the transform t, DY, the Y pitch of the transform t, NX, the X count of the transform t, and NY, the Y count of the transform t. Using these parameters, the width and height of the transform t are computed in function block 507. Specifically, the width is computed as (NX−1)×DX+ frame.WIDTH, and the height is computed as (NY−1)×DY+ frame.HEIGHT. Here, the frame is added to make sure all shapes are covered. The frame $SR_{13}$frame is then computed in function block 508 as the rectangle defined by origin-X, origin-Y and the width and height computed in function block 507. Finally, contents is updated by adding $SR_{13}$frame in function block 509. At this point a return is made to function block 307 in FIG. 21 which called the procedure.

Turning now to FIG. 24, the procedure called in function block 206 in FIG. 20 is shown. This procedure, generate a proper frame, is called after the "contents" are generated in the procedures of FIGS. 22 or 23. The first step in decision block 601 is to determine if the child_cell is used in a step and repeated transform. If so, then in function block 602, frames[cc] generated in function block 203 (FIG. 20) is updated as frames[cc]+bounding box of contents. Otherwise, one of the following methods is selected in function block 603: (1) draw the bounding rectangle of the contents; (2) shrink and expand contents to fill in small holes and notches; (3) remove holes; (4) a "shrink wrap" procedure; and finally, (5) a "convex hull" procedure. The frame generated by one of the selected procedures is saved in frames[cc] in function block 604. At this point, frames[cc] has a proper frame, and a return is made to function block 206 in FIG. 20 which called the procedure.

Figure 25:
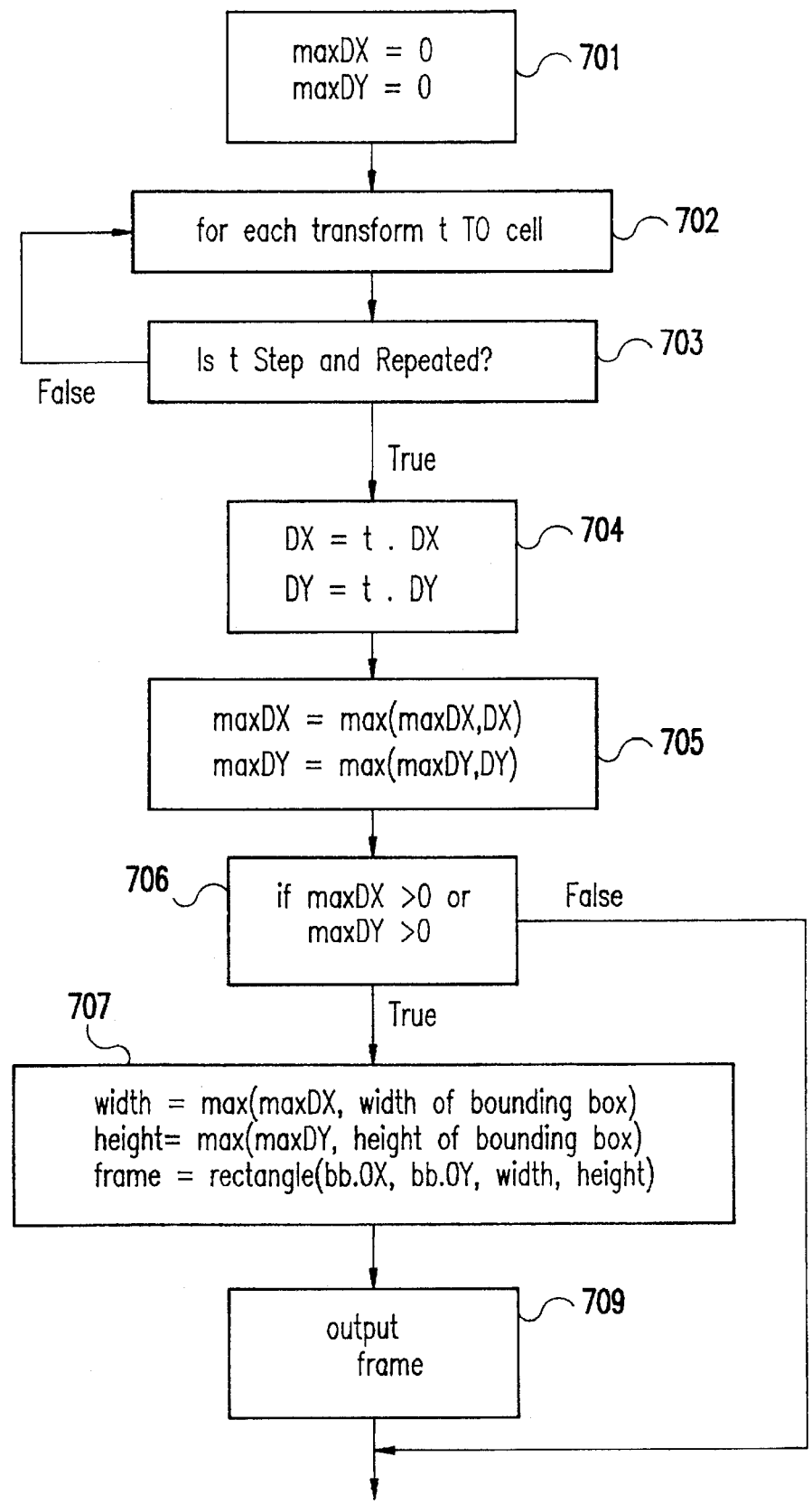
FIG. 25 is a flowchart showing the procedure called in FIG. 20 for generating a frame for the step and repeated transform.

Turning next to FIG. 25, the procedure called in function block 203 in FIG. 20 is shown. This procedure prepares the right fram when it is used in a step and repeat transform by a higher rank cell. The values maxDX and maxDY are first initialized in input block 701. A loop is entered at function block 702 where each transform t is processed to the cell level. If the transform t is not step and repeated, as determined in decision block 703, the process loops back to function block 702; otherwise, the next step in function block 704 is to set DX to t.DX and DY to t.DY. Next, in function block 705, maxDX is set to max(maxDX,DX) and maxDY is set to max(maxDY,DY). A test is made in decision block 706 to determine if either maxDX or maxDY is greater than zero. If so, the width, height and frame are computed in function block 707. Specifically, the width is computed as max(maxDX, width of bounding box), the height is computed as max(maxDY, height of bounding box), and the frame is computed as the rectangle defined by bb.origin-X, bb.origin-Y, width, and height. If neither maxDX nor maxDY is greater than zero as determined in decision block 706, which means the cell is not step and repeated, no frame is computed at this point. The frame output by function block 707 is output as the output frame in function block 709. At this point a return is made to function block 203 in FIG. 20 which called the procedure.

Returning now to FIG. 19, the complement shapes are generated in function block 103 by subtracting the design input shapes from the cellwise complement shapes. In the preferred practice of the invention, the *Shape Instance Method* taught in application Ser. No. 08/019,971, application Ser. No. 08/019,927, application Ser. No. 08/019,924, and application Ser. No. 08/019,970 referenced above is used. The complement shapes computed in function block 103 are output in function block 104, and these shapes are combined in function block 105 with the original input design data. The resulting design can then be used for checking or fabrication, as required.

While the invention has been described in terms of a single preferred embodiment with two applications, those skilled in the art will recognize that the invention can be practiced with modification within the spirit and scope of the appended claims.

Having thus described my invention, what I claim as new and desire to secure by Letters Patent is as follows:

1. A computer-implemented method of efficiently generating nested complemented shapes of a physical design for integrated circuit chip or electronic package designs without flattening or denesting hierarchal design data of the physical design comprising the steps of:

inputting an original design as nested shapes information in a data file;

generating a contents for each cell of the nested shapes information;

generating a proper frame bounding the generated contents for each cell of the nested shapes information;

determining complemented shapes for each cell as a difference between the generated proper frame and the generated contents for each cell of the nested shapes information;

storing the complemented shapes as native shapes in each cell; and removing parts of the complemented shapes that overlap original design level shapes.

2. The computer-implemented method of claim 1 further comprising the steps of:

generating a frame for each step and repeated cell; and storing the generated frame.

3. The computer-implemented method of claim 2 wherein the step of generating a proper frame for each cell comprises the steps of:

determining for each cell whether the cell is a step and repeated cell; and for a step and repeated cell, updating the stored generated frame by adding a bounding box of the generated contents of the cell.

4. The computer-implemented method of claim 1 wherein the step of generating the contents of a cell comprises the steps of:

for each native shape in a cell, updating the contents of the cell by adding the native shape until all native shapes in the cell have been processed;

given a transform to a cell, generating a coordinate transform having a geometric translation;

accessing a stored frame for the cell and applying the coordinate transform to the frame to generate a transformed frame; and updating the contents by adding the transformed frame until all transforms have been processed.

5. The computer-implemented method of claim 4 further comprising the steps of:

determining if a cell is a step and repeated cell;

if a step and repeated cell, setting the transform to an origin coordinate transform; and calculating a width and height of the frame.

6. A computer-implemented method of efficiently determining violations of a maximum space restriction for a physical design of integrated circuit chip or electronic package designs without flattening or denesting hierarchial design data of the physical design comprising the steps of:

inputting an original design nested shapes information in a data file;

generating a contents for each cell of the nested shapes information;

generating a proper frame for each cell of the nested shapes information;

determining error candidate areas in each cell;

storing the error candidate shapes as native shapes in each cell; and removing parts of the error candidate shapes that overlap the original design level shapes.

7. The computer-implemented method of claim 6 further comprising the steps of:

generating a frame for each step and repeated cell; and storing the generated frame.

8. The computer-implemented method of claim 7 wherein the step of generating a proper frame for each cell comprises the steps of:

determining for each cell whether the cell is a step and repeated cell; and for a step and repeated cell, updating the stored generated frame by adding a bounding box of the generated contents of the cell.

9. The computer-implemented method of claim 6 wherein the step of generating the conents of a cell comprises the steps of:

for each native shape in a cell, updating the contents of the cell by adding the native shape until all native shapes in the cell have been processed;

given a transform to a cell, generating a coordinate transform having a geometric translation;

accessing a stored frame for the cell and applying the coordinate transform to the frame to generate a transformed frame; and updating the contents by adding the transformed frame until all transforms have been processed.

10. The computer-implemented method of claim 9 further comprising the steps of:

determining if a cell is a step and repeated cell;

if a step and repeated cell, setting the transform to an origin coordinate transform; and calculating a width and height of the frame.

11. A computer-implemented method of efficiently generating nested complemented shapes of a hierarchical design data file without flattening or denesting hierarchal design data comprising the steps of:

inputting an original design as nested shapes information in a data file;

generating a contents for each cell of the nested shapes information;

generating a proper frame bounding the generated contents for each cell of the nested shapes information;

determining complemented shapes for each cell as a difference between the generated proper frame and the generated contents for each cell of the nested shapes information; and storing the complemented shapes as native shapes in each cell.

* * * * *